United States Patent
Jeng et al.

(10) Patent No.: US 6,962,864 B1
(45) Date of Patent: Nov. 8, 2005

(54) WIRE-BONDING METHOD FOR CHIPS WITH COPPER INTERCONNECTS BY INTRODUCING A THIN LAYER

(75) Inventors: Yeau-Ren Jeng, Tainan (TW); Sang-Mao Chiu, Da-Lin (TW)

(73) Assignee: National Chung Cheng University, Chia-Yi (TW)

( * ) Notice: Subject to any disclaimer, the term of this patent is extended or adjusted under 35 U.S.C. 154(b) by 0 days.

(21) Appl. No.: 10/855,161

(22) Filed: May 26, 2004

(51) Int. Cl.$^7$ ............................................... H01L 21/44
(52) U.S. Cl. ...................................... 438/617; 438/612
(58) Field of Search ................................. 438/617, 612

(56) References Cited

U.S. PATENT DOCUMENTS

| | | | |
|---|---|---|---|
| 5,756,380 A | * 5/1998 | Berg et al. | 438/126 |
| 5,955,782 A | * 9/1999 | Kosteva et al. | 257/720 |
| 6,770,971 B2 | * 8/2004 | Kouno et al. | 257/734 |

* cited by examiner

Primary Examiner—Luan Thai

(57) ABSTRACT

A wire-bonding method for chips with copper interconnects by introducing a thin layer is provided for solving the problem of oxidizing a copper bonding-pad during bonding processing in order not to deteriorate the bonding strength and yield rate thereof. The wire-bonding method of the present invention comprises: a step for providing a chip with a copper bonding-pad; another step for providing an aqueous solution to form a Cuprous oxide thin layer on the copper bonding-pad; and yet another step for setting a plurality of copper interconnects on the copper bonding-pad and providing an ultrasonic power for removing the Cuprous oxide layer to have the interconnects bonded on the copper bonding-pad.

7 Claims, 3 Drawing Sheets

WIRE-BONDING METHOD FOR CHIPS WITH COPPER INTERCONNECTS BY INTRODUCING A THIN LAYER

BACKGROUND OF THE INVENTION

1. Field of the Invention

The present invention relates to the application field regarding IC packaging, particularly to a wire-bonding method for chips with copper interconnects by introducing a thin layer.

2. The Prior Arts

In the VLSI (Very Large Scale Integration) era today, an IC chip is made through several steps including wafer fabricating process, wafer test, VLSI forming process, and finally, IC packaging test.

The packaging test usually comprises a wafer attachment process, a wire-bonding process, etc., in which the wire-bonding process is conducted by a wire bonder for connecting a chip to a plurality of pins with metallic interconnects under a high-temperature and ultrasonic environment. The bonded interconnects serve as a bridge for transmitting signal and/or electric power between a chip and the external circuits. Since, almost all the makers have made different efforts to try minimizing the volume of chip as smaller as possible, and accompanying with the scaling-down semiconductor devices, the RC constant of interconnect is increased rapidly because the resistance of the metal leading increases with decreasing line width and the interconnect capacitance increases with decreasing spacing, hence, a greater resistance and capacitance is inevitably resulted when the width of wire and the space between lead wires in chip are narrowed.

On the other hand, the performance of deep sub-micron integrated circuit cannot be further improved since the delay of signal in the interconnect would exceed the delay of signal in the device. Therefore, it is necessary to use interconnects with better conductivity to replace conventional Aluminum. Copper has been identified as the best candidate due to its low resistivity, high electromigration resistance and likely lower processing cost. However, one of the disadvantages of copper is that copper is readily oxidized at low temperature, and unlike the oxidation of aluminum, the oxidation rate of copper is fast, and no self-protective oxide layer forms to prevent further oxidation. Such characteristic will deteriorate the effect in transmitting the frictional power of ultrasonic vibrations to the surface of the copper bonding-pad while bonding interconnects to the chip, so that the efficiency for stripping the oxide layer off and obtaining therethrough a smooth bonding on the surface of the copper bonding-pad is retarded, and accordingly is the yield rate. Hence, the key point for obtaining a good yield in the wire-bonding process is to prevent the copper bonding-pad from being oxidized rapidly owing to the temperature of a bonding interface.

For improvements, two ways have been suggested: (1) An inertia gas (Ar) is applied to a chip during the wire-bonding process to protect the surface thereof and lower down the temperature to slow down oxidation. (2) A thin barrier layer, a Titanium layer for example, is sputtered on the surface of a chip to prevent oxidation of the copper-bonding pad. These ways are capable of avoiding oxidation of the copper bonding-pad and enhancing the strength of bonding points though, they are both expensive and troublesome.

SUMMARY OF THE INVENTION

The primary object of the present invention is to provide a wire-bonding method for chips with copper interconnects by introducing a thin layer to prevent the problem of oxidizing a copper bonding-pad during a bonding process.

The wire-bonding method for chips with copper interconnects by introducing a thin layer comprises: providing a chip associated with a copper bonding-pad; providing an aqueous solution to form a Cuprous oxide thin layer on the copper bonding-pad; and setting copper interconnects on the copper bonding-pad and providing an ultrasonic power for removing the Cuprous oxide layer to have the copper interconnects bonded on the copper bonding-pad.

The wire-bonding method for chips with copper interconnects by introducing a thin layer is advantageous in that a Cuprous oxide layer formed on the copper bonding-pad can prevent the pad from being oxidized further, and the layer is removable by ultrasonic power to ensure a better wire bonding.

With a proper control of pH value, the aqueous solution can work to produce the Cuprous oxide layer on the copper bond-pad in a low cost.

For more detailed information regarding advantages or features of the present invention, at least one example of preferred embodiment will be described below with reference to the annexed drawings.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

Figure 1A:
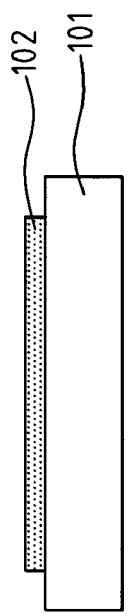
FIGS. 1A and 1B are schematic views showing a chip, a copper-bonding pad, and/or a thin layer of Cuprous oxide formed thereon, subsequently.

As shown in FIG. 1A, a chip 101 is provided thereon with a copper bonding-pad 102. The chemical reaction of copper in an aqueous solution is known as:

  (1)

  (2)

  (3)

According to the principle of Le Chatelier, a system would always react in such a way as to tend to counteract the original alteration when the system is in equilibrium and one of the factors, which determine the equilibrium point, is altered. It is understood from reaction (3) that $H^+$ is supposed to move to the left side when its concentration is raised up. If the concentration of $H^+$ goes up, the aqueous solution is becoming acidified and the pH value is lowered (the higher the $H^+$, the lower the pH value), or vice versa. Therefore, it is possible to keep the reaction going toward the right hand to produce Cuprous oxide ($Cu_2O$) should the concentration of $H^+$ is controlled properly under a predetermined level. A preferred concentration of H+ below $10^{-5}$ M/L, or a pH value greater than 5, is found by experiments.

Figure 1B:
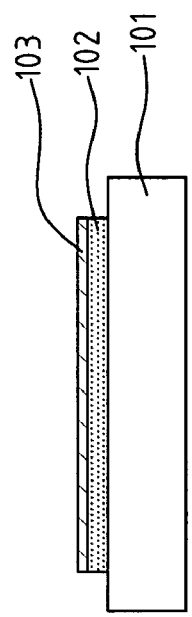

As shown in FIG. 1B, an aqueous solution with a pH value greater than 5 is provided to the upper surface of the copper bonding-pad 102 for reaction, and then, after 30–180 seconds in room temperature, the solution is removed away to form a thin layer 103 of Cuprous oxide ($Cu_2O$) of 10–500 Å in thickness attached on the surface of the copper bonding-pad 102 for protecting the copper bonding-pad 102 from being oxidized. Since the created Cuprous oxide 103 is rigid and fragile, it can be shocked and crushed easily by ultrasonic power and therefore removed away to expose the copper bonding-pad 102.

The aqueous solution applied could be a solution of any kind having a pH value between 5–14, including a weak acid, neutral, weak alkaline, or active alkaline aqueous solution.

Moreover, there is no specified quantity of aqueous solution to be provided on the surface of the copper bonding-pad 102, and it is considered good enough as long as it can fully cover the surface of the copper bonding-pad 102.

Figure 2D:
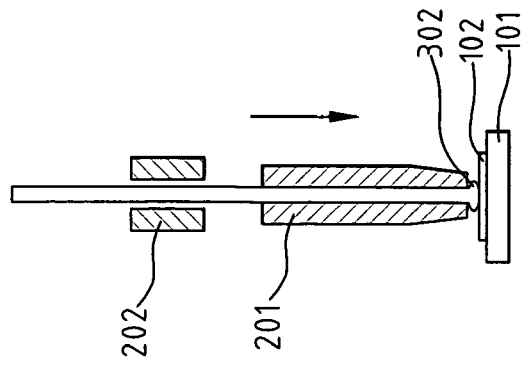
FIGS. 2A through 2H are schematic views showing a wire-bonding method of the present invention.
Figure 2C:
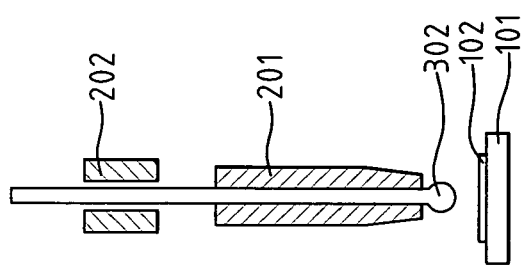
Figure 2B:
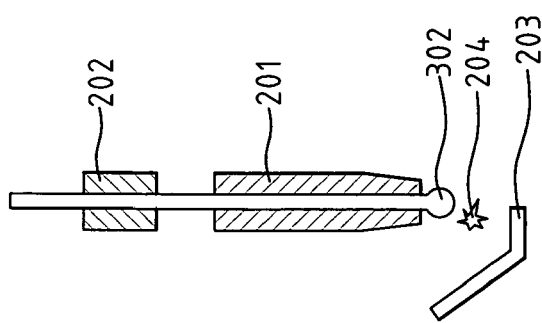
Figure 2A:
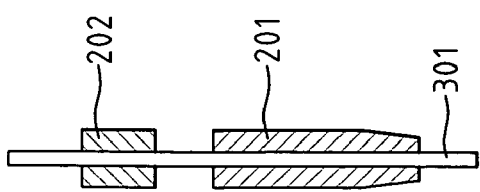

With reference to FIGS. 2A–2H, which show a wire-bonding method in accordance with the present invention, a wire-penetrating process of the wire-bonding method is shown in FIG. 2A, in which a bonding wire 301 is guided to penetrate through a fixture 202 and a steel cylinder 201, where the bonding wire 301 could be made of gold.

FIG. 2B shows a ball-forming process of the wire-bonding method, in which a spark 204 is ignited by an igniter 203 to hence form a bonding ball 302.

FIG. 2C shows a positioning process of the wire-bonding method, in which the chip 101 is located exactly under the steel cylinder 201 in alignment with the copper bonding-pad 102. This arrangement provides a preheat and ultrasonic environment, in which the temperature range of the preheat environment is 200–260° C., and the rigid and fragile thin layer of Cuprous oxide (not shown) on the copper bonding pad 102 can be removed easily by the ultrasonic waves.

FIG. 2D shows a bonding process of the wire-bonding method for a first bonding point, in which the steel cylinder 201 is moved downwards to allow the bonding ball 302 to contact the copper bonding-pad 102 to be bonded thereon.

Figure 2H:
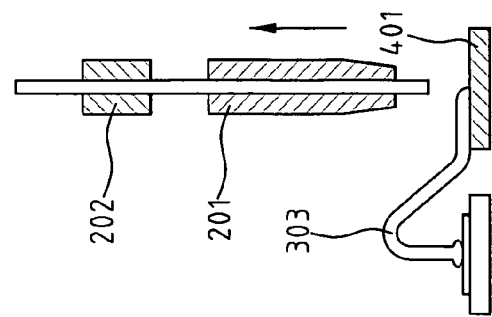
Figure 2G:
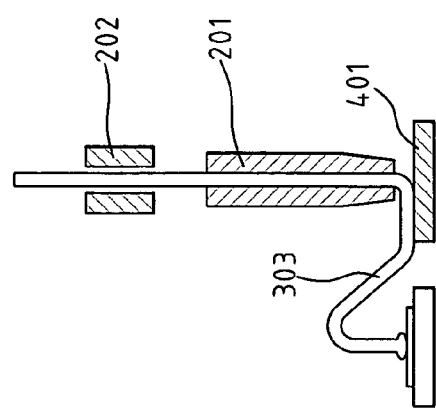
Figure 2F:
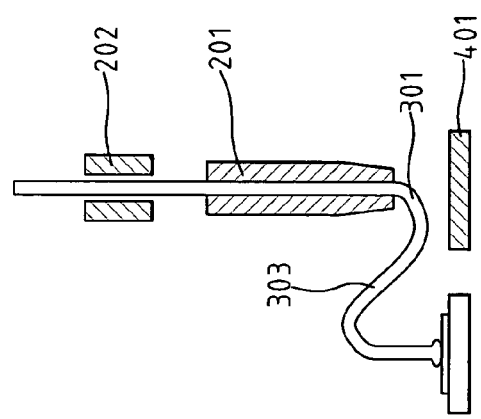
Figure 2E:
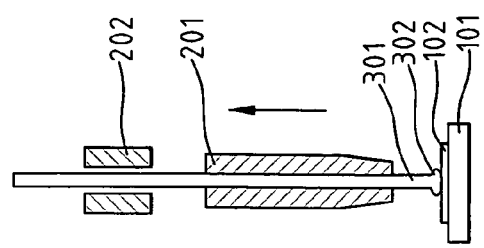

FIG. 2E shows a rising process of the wire-bonding method for the steel cylinder 201 to enable the bonding wire 301 to extend an extra length owing to the unclosed fixture 202.

FIG. 2F shows a forming process of the wire-bonding method for a bonding wire loop, in which the steel cylinder 201 is moved above and aligned with a lead frame 401, and at this time, the bonding wire 301 is dragged out to form a loop structure 303.

FIG. 2G shows a bonding process of the wire-bonding method for a second bonding point, in which the steel cylinder 201 descends to allow the bonding wire 301 to contact with and get bonded on the lead frame 401 to form the second bonding point.

FIG. 2H shows a wire-tearing process of the wire-bonding method, in which the steel cylinder 201 rises to close up the fixture 202, where the bonding wire 301 is torn and broken to have the integral loop structure 303 of bonding wire completed.

In the above described, at least one preferred embodiment has been described in detail with reference to the drawings annexed, and it is apparent that numerous changes or modifications may be made without departing from the true spirit and scope thereof, as set forth in the claims below.

What is claimed is:

1. A wire-bonding method for chips with copper interconnects by introducing a thin layer, comprising following steps:
    (a) providing a chip having a copper bonding-pad;
    (b) providing an aqueous solution to react with the surface of the copper bonding-pad to form a Cuprous oxide thin layer on the copper bonding pad; and
    (c) setting a plurality of copper interconnects on the copper bonding-pad and providing an ultrasonic power for removing the Cuprous oxide thin layer to have the copper interconnects bonded on the copper bonding-pad, in which the pH value of the aqueous solution is 5–14.

2. The wire-bonding method according to claim 1, wherein the reaction time of the aqueous solution and the surface of the copper bonding-pad in step (b) is about 30–180 seconds.

3. The wire-bonding method according to claim 1, wherein the Cuprous oxide thin layer is 10–500 Å in thickness.

4. The wire-bonding method according to claim 1, wherein the material of bonding wire is gold.

5. The wire-bonding method according to claim 1, wherein the step (c) requires a wire bonder when bonding the copper interconnects.

6. The wire-bonding method according to claim 5, wherein a step of preheating up to 200–260° C. is further included.

7. The wire-bonding method according to claim 1, wherein which a step of connecting a bonding wire with a plurality of lead frames after step (c) is further included.

\* \* \* \* \*